United States Patent [19]

Desmarais

[11] 4,376,898

[45] Mar. 15, 1983

[54] BACK BIAS REGULATOR

[75] Inventor: Richard Z. Desmarais, Cupertino, Calif.

[73] Assignee: Data General Corporation, Westboro, Mass.

[21] Appl. No.: 125,770

[22] Filed: Feb. 29, 1980

[51] Int. Cl.[3] .......................... H03K 3/01; H03K 3/353

[52] U.S. Cl. .......................................... 307/297; 307/304

[58] Field of Search ................................ 307/297, 304

[56] References Cited

U.S. PATENT DOCUMENTS

| | | | |
|---|---|---|---|
| 3,657,575 | 4/1972 | Taniguchi et al. | 307/297 |
| 3,806,741 | 4/1974 | Smith | 307/304 |
| 4,049,980 | 9/1977 | Maitland | 307/297 |
| 4,142,114 | 2/1979 | Green | 307/297 |
| 4,223,238 | 9/1980 | Parkinson et al. | 307/297 |

OTHER PUBLICATIONS

Pashley & McCormick, "THPM 12.6: A 70-ns 1K MOS RAM", 1976 IEEE International Solid-State Circuits Conference, pp. 138-139, 238.

*Primary Examiner*—Bruce Y. Arnold

[57] ABSTRACT

An improved regulator circuit alters the back bias generator voltage at the substrate of an MOS integrated circuit. The regulator circuit is responsive not only to circuit parameters sensed by prior art regulators, but to additional ones including internal clock pulse voltage levels.

3 Claims, 3 Drawing Figures

NORMAL OPERATION

HEAVY REGULATION

BACK BIAS REGULATOR

BACKGROUND OF THE INVENTION

The present invention relates to an improved regulator circuit and in particular to an improved regulator circuit for a back bias generator for an MOS integrated circuit.

It has become common to use a back bias generator circuit with dynamic MOS circuits. A back bias generator applies a negative voltage on the "back" or substrate of an MOS integrated circuit. Without a back bias generator the normal voltage for the substrate is zero volts. This back or substrate bias is used to reduce device body effect and parasitic junction capacitance. This has the effect of insuring more reliable switching of the internal MOS logic elements. One such back bias generator is described in an article entitled "THPM 12.6: A 70-ns 1K MOS RAM" by Pashley and McCormick, 1976 IEEE International Solid-State Circuits Conference, pp. 138–139, 238.

Existing back bias generators typically sense only two parameters, $V_{TE}$ and $V_{BB}$. The former is the threshold voltage. This refers to the voltage difference between the gate and the source required to change the state of the MOS element. $V_{TE}$ must be exceeded for it to become fully conducting. $V_{BB}$ stands for the back-bias voltage applied to the substrate. For example if $V_{TE}$ should happen to increase then this is sensed; the back-bias is increased, i.e. made less negative; and as a result, the MOS element becomes more sensitive to an incoming clock pulse than it would otherwise be.

These methods compress the variation range of $V_{TE}$ and effectively tighten the circuit processing limits. But they do not compensate for insufficient clock amplitude and other important circuit parameters.

SUMMARY OF THE INVENTION

It is therefore an object of the invention to provide improved back bias voltage generation for an MOS integrated circuit.

Another object of the invention is to provide a regulator circuit for a back bias voltage generator for an MOS integrated circuit which is responsive to a variety of circuit variables and parameters.

Another object of the invention is to provide a back bias regulator which is responsive to variations in the level of internal block pulses.

In accordance with the present invention, an improved regulator circuit provides a regulating signal to alter the back bias voltage to the substrate of an MOS integrated circuit in accordance with variations in key circuit parameters. The regulator circuit includes a sensing circuit responsive to internal clock pulses. The output of the sensing circuit, a sense signal, is stored as a d.c. voltage level. Means are then provided to provide a signal to the MOS substrate to regulate the back bias voltage level if the stored d.c. sense voltage fails to reach a specified level in one clock pulse period.

The regulator circuit of the present invention senses and compensates for variations in the following parameters which affect circuit performance, in addition to $V_{TE}$ and $V_{BB}$, and provides a regulating signal to the back bias generator to compensate for such variations: internal clock signals, enhancement conduction factor ($K_e'$), depletion conduction factor ($K_e'$) and supply voltage ($V_{cc}$).

DESCRIPTION OF THE PREFERRED EMBODIMENT(S)

Figure 1:
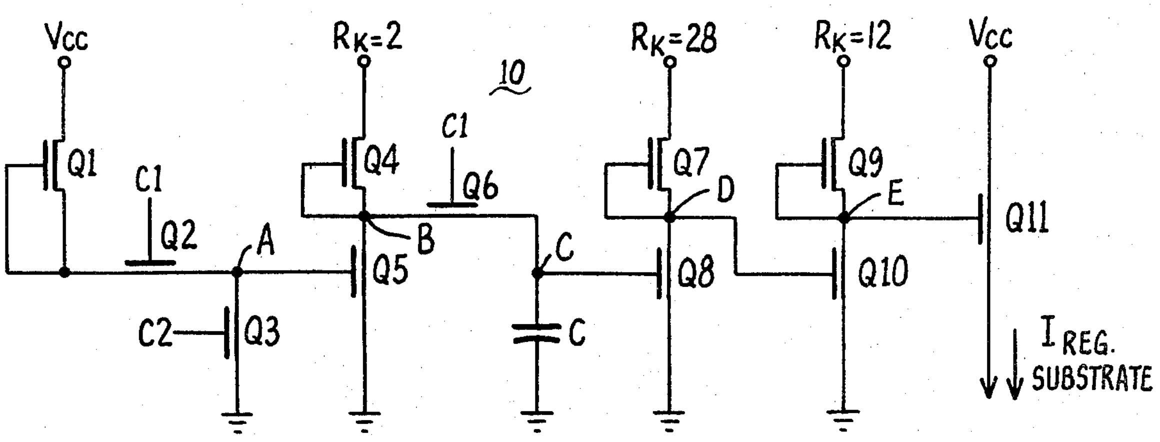
FIG. 1 is an electrical schematic diagram of the improved back bias regulator circuit of the present invention.

FIG. 1 is a schematic circuit diagram of the improved back bias regulator circuit 10 of the present invention. The output of the regulator circuit 10 is a regulating current, $I_{reg}$, which regulates the back bias voltage to the substrate of an MOS integrated circuit. Typically, maximum back bias voltage is −4 v. and minimum is 0 v.

Regulator circuit 10 includes eleven MOS transistors, $Q_1$–$Q_{11}$. The function of these transistors is explained subsequently. Transistors $Q_1$, $Q_4$, $Q_7$ and $Q_9$ are depletion devices and the remaining are enhancement devices. A depletion device is normally "on," i.e., conducting. The opposite is the case for enhancement MOS transistors. An enhancement MOS device is normally "off," except for leakage current, and a signal must be applied to its gate to turn in "on."

Transistors $Q_1$, $Q_2$, and $Q_3$ and inverter Rk=2 form a sensing circuit. Inverter Rk=2 is made up of pull-up transistor $Q_4$ and pull-down transistor $Q_5$. Internal clock pulses $c_1$ are applied to the gate of $Q_2$ and internal clock pulses $c_2$ are applied to the gate of $Q_3$. Normal level clock pulses $c_1$ and $c_2$ are shown as the bottom two waveforms of FIG. 2. The designation Rk=2 means that the width/length ratio of pull-down transistor $Q_5$ is two times that of pull-up transistor $Q_4$.

Inverter Rk=2 is deliberately made to be slower, hence more sensitive to low input levels, than the other inverters in regulator 10. More specifically inverter Rk=2 is more sensitive than the inverter comprising $Q_7$ and $Q_8$ and the inverter comprising $Q_9$ and $Q_{10}$. The former inverter has a value of Rk=28. This means that pull-down transistor $Q_8$ has 28 times the width/length ratio as pull-up transistor $Q_7$. The inverter made up of $Q_9$ and $Q_{10}$ has a value of Rk=12. Both of these inverters are less sensitive than the Rk=2 inverter. Thus the Rk=2 inverter is the first inverter in the circuit which fails to change the state of its pull-down transistor, for example, in the case of a marginal gate input.

Figure 2:
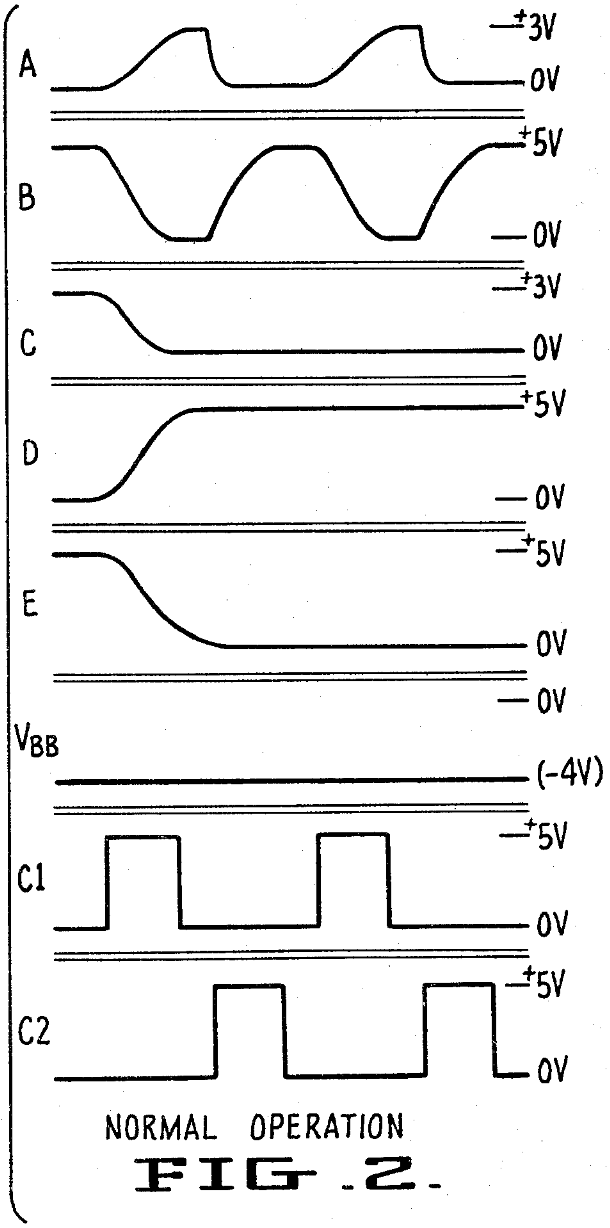
FIG. 2 is a series of signal waveforms which occur during the operation of the back bias regulator circuit of FIG. 1, under normal circuit operating conditions.

Operation of regulating circuit 10 is best understood by referring additionally to FIG. 2. In addition to showing the internal clock signals $c_1$ and $c_2$, wave forms of signals at points A–D are shown. These waveforms illustrate the operation of the regulating circuit 10 under normal conditions. In this case, the output $I_{reg}$ is at its minimum value and the maximum bias, typically −4 v., is applied to the MOS substrate.

When there is no clock pulse present, point A is at ground since $Q_2$ is off. This means $Q_5$ is also off and point B is at $V_{cc}$, or approximately +5 v. When $Q_2$ is clocked by $c_1$, $Q_1$ turns on and there is an approximately two volt drop across it. Since $V_{cc}$ in this particular embodiment is +5 v, the voltage at the gate of $Q_5$, A, is approximately +5 v−2 v, or +3 v. This is shown in FIG. 2. The output of the inverter Rk=2, point B, goes to ground, as $Q_5$ turns on. When $Q_3$ is clocked by $c_2$ point A goes to ground, and point B goes to $V_{cc}$, 5 v. See FIG. 2.

$Q_6$ conducts when clock pulse $c_1$ is provided at its gate. Since point B is at ground during $c_1$ under normal conditions a current path is provided to capacitor C, which discharges to ground. This turns off pull-down transistor $Q_8$ and charges point D, which in turn turns on $Q_{10}$ which is also a pull-down transistor. This causes point E to go to ground as shown in FIG. 2.

$Q_{11}$ acts as a source of regulator current. The back bias generator, not shown, provides a negative current to the integrated circuit substrate. Because of the capacitance of the substrate, a negative voltage results across it when a negative current is provided to the substrate. Regulator 10 provides a current, from $Q_{11}$, which is positive and therefore subtracts from or "opposes" the current from the back bias voltage generator. During normal circuit operation the current from $Q_{11}$ is near zero. When regulation is required $Q_{11}$ provides a larger positive current to the substrate as required.

Thus when point D goes to zero, $Q_{11}$ reduces $I_{reg}$ to a minimum value determined by the gate to source voltage of $Q_{11}$. This leaves $V_{BB}$ slightly loaded as desired under normal conditions. However, if circuit conditions deteriorate, $Q_{11}$ provides greater positive current to the substrate to counteract $V_{BB}$, i.e. to make $V_{BB}$ less negative. The manner in which regulator circuit 10 accomplishes this is explained below.

Figure 3:
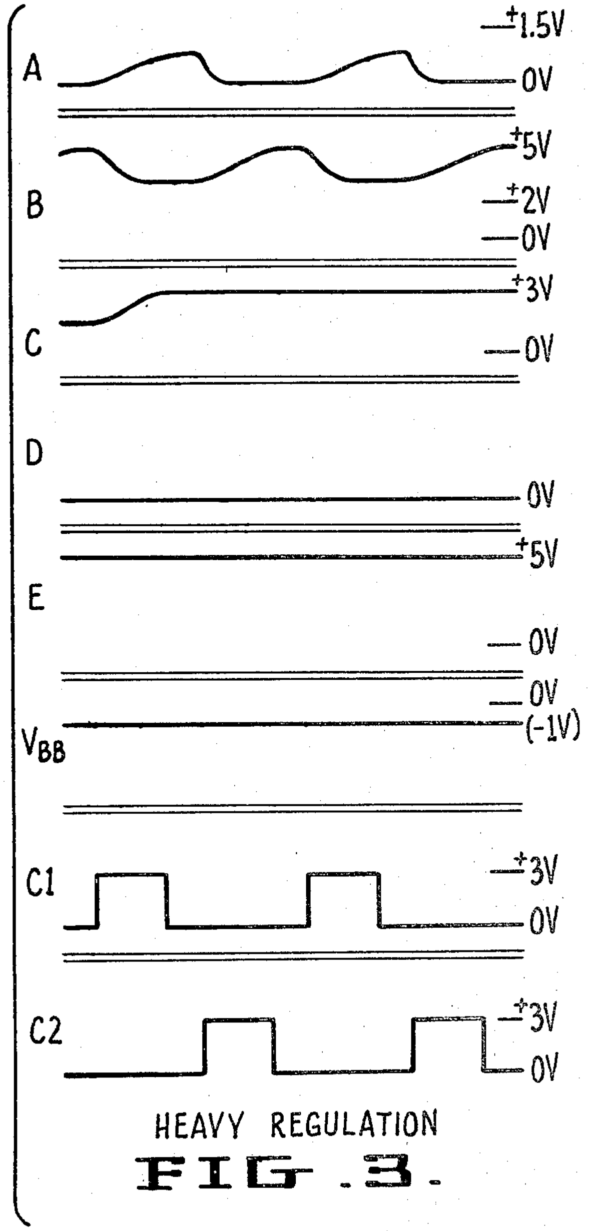
FIG. 3 is a series of signal waveforms which occur during the operation of the back bias regulator circuit of FIG. 1, under abnormal circuit operating conditions.

As an example, the situation where the clock pulses $c_1$ and $c_2$ deteriorate in amplitude is now discussed. The operation of regulator circuit 10 under these circumstances is best understood by additionally referring to FIG. 3. Because of the low amplitude of clock pulses $c_1$, $Q_2$ does not conduct as much as under normal conditions. Accordingly there is a greater voltage drop across $Q_2$ and so the voltage at A is lower than it is in the case illustrated in FIG. 2.

As a result $Q_5$ is not fully turned on, capacitor C charges during $c_1$ clock pulse, and pull-down transistor $Q_8$ conducts discharging point D. This means that $Q_{10}$ is nonconducting and the point E voltage, $Q_{11}$'s gate voltage, is equal to $V_{cc}$ or +5 v. This turns $Q_{11}$ on hard providing maximum positive current to the substrate. This causes the substrate to become more positive which reduces $V_{TE}$ according to the equation:

$$V_{TE} = V_{TO} + M\left[\sqrt{V_{BBI} + 0.6} - \sqrt{0.6}\right]$$

Where:

$V_{TO}$ is the enhancement threshold at zero back bias voltage

M is body factor $V_{BB}$ is back bias voltage

The reduction of $V_{TE}$ allows the Rk=2 inverter comprising $Q_4$ and $Q_5$ to switch at a lower input voltage. It also allows point A to reach a higher "1" level voltage in one clock period since:

$$V_{Amax} = V_{cc} - V_{TE}$$

The final result is a negative feedback voltage applied to the regulator transistor $Q_{11}$, so that $I_{reg}$ is reduced to an equilibrium value just sufficient to support a "1" level at point A.

Since the Rk=2 inverter requires a greater "1" level, i.e., it requires a greater gate voltage on pull-down transistor $Q_5$, than all other inverters on the MOS chip, using it to sense the voltage at point A ensures reliable switching of internal logic elements. Point A charges and discharges every clock cycle from $V_{cc}$ through the circuit composed of depletion transistor $Q_1$ and enhancement transistor $Q_2$. This circuit is designed to have worst case charging times. It is slower than other internal circuits. Thus if process parameters are marginal on the "slow" side or $V_{cc}$ is low, point A will fail to reach a sufficient "1" level in one clock cycle. Thus regulation will occur to raise the voltage at point A thereby reducing its charging time along with internal logic circuits. This compensates for low $K_d'$, $K_e'$ and $V_{cc}$.

In the embodiment of FIG. 1 with the back bias generator providing −100 micro-amps to the MOS substrate, regulator 10 is capable of providing up to a maximum of about +80 micro-amps of current to the substrate. The parameters of regulator 10 of FIG. 1 are as follows, where the number given for each transistor is the ratio of its width to length:

C=0.1 p.f.
$Q_1$=0.5
$Q_2$=1
$Q_3$=1
$Q_4$=0.5
$Q_5$=1
$Q_6$=1
$Q_7$=0.25
$Q_8$=7
$Q_9$=0.25
$Q_{10}$=3
$Q_{11}$=0.3

Of course alternatives to the particular circuit configuration of FIG. 1 to accomplish the purpose of the present invention will be apparent to those skilled in the art. For example, the depletion transistors utilized in the circuit are not a requirement. Also, while inverters are shown, other amplifying means can be used to implement the invention.

I claim:

1. In an MOS integrated circuit with switching performance controlled by the presence of specified circuit parameters including internal circuit clock pulses, and having a generator to back bias the integrated circuit substrate, an improved back bias generator regulator circuit comprising:

regulator means for providing a regulating signal to produce a back bias substrate signal to offset any adverse influence of changing circuit parameters on the switching performance of said MOS integrated circuit;

sensing means responsive to internal circuit clock pulses within the MOS integrated circuit substrate for providing a sense signal;

means for storing the sense signal as a d.c. level; and means for providing a signal to said regulator means to regulate the back bias voltage if the stored sense voltage fails to reach a specified level in one clock pulse period.

2. A circuit for regulating the back bias voltage at the substrate of an MOS integrated circuit comprising:

means sensitive to changing circuit conditions of insufficient levels of internal clock signals to provide a sense signal;

means for storing the sense signal; and means responsive to said stored sense signal to provide a regulating signal to alter the back bias voltage depending upon the level of the stored sense signal within the period of time of one clock pulse.

3. A back bias generator regulating circuit for an MOS integrated circuit comprising:

a sensing circuit responsive to internal clock signals to provide a sense signal having a level dependent upon circuit conditions;

an inverter circuit comprising pull-up and pull-down transistors responsive to said sense signal, said inverter circuit being more sensitive than other inverter circuits in the MOS integrated circuit;

means for storing the sense signal as a d.c. level;

regulator means for providing a signal to alter the magnitude of the back bias voltage; and means responsive to said stored d.c. signal for providing a signal to said regulator means to regulate the back bias voltage if the stored sense voltage fails to reach a specified level in one clock pulse.

* * * * *